United States Patent
Gorday et al.

(10) Patent No.: US 11,804,811 B2
(45) Date of Patent: Oct. 31, 2023

(54) APPARATUS FOR DETERMINING WHEN AN AUTOMATIC GAIN CONTROL CIRCUIT HAS SETTLED

(71) Applicant: Silicon Laboratories Inc., Austin, TX (US)

(72) Inventors: Robert M. Gorday, Gainesville, FL (US); Guner Arslan, Austin, TX (US); Marc Leroux, Austin, TX (US); Pascal Blouin, Domloup (FR)

(73) Assignee: Silicon Laboratories Inc., Austin, TX (US)

( * ) Notice: Subject to any disclaimer, the term of this patent is extended or adjusted under 35 U.S.C. 154(b) by 314 days.

(21) Appl. No.: 17/243,760

(22) Filed: Apr. 29, 2021

(65) Prior Publication Data

US 2022/0352861 A1 Nov. 3, 2022

(51) Int. Cl.
*H04B 1/06* (2006.01)
*H03G 3/30* (2006.01)
*H03F 3/21* (2006.01)
*H03F 3/193* (2006.01)

(52) U.S. Cl.
CPC .......... *H03G 3/3036* (2013.01); *H03F 3/193* (2013.01); *H03F 3/21* (2013.01); *H03G 3/3089* (2013.01); *H03F 2200/294* (2013.01)

(58) Field of Classification Search
CPC .... H03G 3/3036; H03G 3/3089; H03G 3/001; H03G 2201/103; H03G 2201/106; H03G 2201/202; H03G 2201/307; H03G 3/30; H03G 1/0088; H03G 1/0023; H03G 3/3042; H03G 3/3047; H03F 3/193; H03F 3/21; H03F 2200/294; H03F 2200/451; H03F 1/0261
USPC ......................................... 330/278, 279, 285
See application file for complete search history.

(56) References Cited

U.S. PATENT DOCUMENTS

| | | | |
|---|---|---|---|
| 6,226,504 B1 * | 5/2001 | Takagi | H03G 3/3068 455/249.1 |
| 6,442,380 B1 | 8/2002 | Mohindra | |
| 7,046,976 B2 * | 5/2006 | Le Naour | H04N 5/52 375/345 |
| 7,227,916 B2 | 6/2007 | Ruelke et al. | |
| 7,890,075 B2 * | 2/2011 | Xin | H03G 3/3068 375/345 |
| 7,995,980 B2 | 8/2011 | Lu | |
| 8,180,308 B1 | 5/2012 | Neng | |
| 8,346,202 B2 | 1/2013 | Coban et al. | |
| 8,860,590 B2 | 10/2014 | Yamagata et al. | |

(Continued)

*Primary Examiner* — Khanh V Nguyen
(74) *Attorney, Agent, or Firm* — Trop, Pruner & Hu, P.C.

(57) ABSTRACT

In one embodiment, an apparatus includes: a low noise amplifier (LNA) to receive and amplify a radio frequency (RF) signal, the LNA having a first controllable gain; a mixer to downconvert the RF signal to a second frequency signal; a programmable gain amplifier (PGA) coupled to the mixer to amplify the second frequency signal, the PGA having a second controllable gain; a digitizer to digitize the second frequency signal to a digitized signal; a demodulator coupled to the digitizer to demodulate the digitized signal; an automatic gain control (AGC) circuit to control one or more of the first controllable gain and the second controllable gain; and an AGC settling circuit to cause the demodulator to begin operation in response to determining that the AGC circuit has settled.

20 Claims, 9 Drawing Sheets

(56) References Cited

U.S. PATENT DOCUMENTS

| | | | |
|---|---|---|---|
| 8,983,418 B2 | 3/2015 | Ibrahim et al. | |
| 9,001,941 B2 | 4/2015 | Manglani et al. | |
| 9,065,525 B1 * | 6/2015 | Yosoku | H04B 1/123 |
| 9,172,344 B2 | 10/2015 | Green et al. | |
| 9,831,836 B1 | 11/2017 | de Ruijter | |
| 10,230,345 B1 * | 3/2019 | Arslan | H04B 1/0007 |
| 10,469,112 B2 | 11/2019 | Coban | |
| 10,819,302 B1 * | 10/2020 | Srinivasan | H04B 1/109 |
| 11,296,740 B2 * | 4/2022 | Midha | H04B 1/123 |
| 2005/0250462 A1 | 11/2005 | Wu et al. | |

* cited by examiner

APPARATUS FOR DETERMINING WHEN AN AUTOMATIC GAIN CONTROL CIRCUIT HAS SETTLED

BACKGROUND

In radio receivers, an incoming radio frequency (RF) signal is received, typically by an antenna. The signal is then processed in a signal processing path of the receiver. General receive operations include amplification, filtering, downconversion, and digitization, resulting in a digitized signal that can then be digitally processed, such as demodulation for a particular modulation technique.

Many receivers include multiple amplifiers or other gain components. At least some of these gain components may be controlled. There is some amount of settling time for the gain components to be appropriately adjusted for a given RF signal. Desirably, this settling time is as small as possible, as operations such as demodulation can be adversely impacted by changes in gain. For example, difficulties in signal processing may occur as a result of these gain changes.

SUMMARY OF THE INVENTION

In one aspect, an apparatus includes: a low noise amplifier (LNA) to receive and amplify a radio frequency (RF) signal, the LNA having a first controllable gain; a mixer to downconvert the RF signal to a second frequency signal; a programmable gain amplifier (PGA) coupled to the mixer to amplify the second frequency signal, the PGA having a second controllable gain; a digitizer to digitize the second frequency signal to a digitized signal; a demodulator coupled to the digitizer to demodulate the digitized signal; an automatic gain control (AGC) circuit to control one or more of the first controllable gain and the second controllable gain; and an AGC settling circuit to cause the demodulator to begin operation in response to determining that the AGC circuit has settled.

In an example, the AGC settling circuit is to send a settling indicator to the demodulator having a first value before the AGC circuit has settled and having a second value in response to determining that the AGC circuit has settled. The apparatus may further include a controller to prevent the demodulator from operation in response to the settling indicator having the first value. The AGC settling circuit may include a decision circuit to determine whether a gain change is greater than at least one threshold during a first duration. The decision circuit, in response to determining that the gain change is less than the at least one threshold during the first duration, is to send the settling indicator having the second value after a second duration following the first duration.

In an example, the apparatus further comprises a calculation circuit to calculate a composite gain index according to a sum of a first gain index for the LNA and a second gain index for the PGA. The apparatus may further include a passive gain stage coupled to the LNA, the passive gain stage having a third controllable gain. The calculation circuit may calculate the composite gain index according to a sum of the first gain index for the LNA, the second gain index for the PGA, and a third gain index for the passive gain stage.

In an example, the decision circuit is to determine the gain change based on the composite gain index and a prior composite gain index. The AGC settling circuit may include a first counter to count a first count corresponding to the first duration, where the decision circuit is to reset the first counter in response to determining that the gain change is greater than the at least one threshold during the first duration.

The AGC circuit may enter into a safe mode when the AGC circuit has settled, where in the safe mode, the AGC circuit is to limit an amount of gain change to one or more of the LNA and the PGA. The apparatus may further include a non-volatile storage to store a first set of gain control values and a second set of gain control values. The AGC circuit may send the first set of gain control values to at least the LNA and the PGA before the AGC circuit is settled and send the second set of gain control values to at least the LNA and the PGA after the AGC circuit is settled.

In another aspect, a method comprises: sending a settling indicator from a first circuit to a demodulator circuit of a receiver, the settling indicator having a first value to indicate that an AGC circuit of the receiver is not settled; determining that an AGC gain value change does not exceed a threshold level during a settling window; and thereafter sending the settling indicator to the demodulator circuit having a second value to indicate that the AGC circuit has settled.

In an example, the method further comprises initializing a delay window following a completion of the settling window. In an example the settling window is initialized in response to the AGC gain value change exceeding the threshold level during the settling window.

In an example, the method further comprises sending the settling indicator having the second value after the delay window is completed. The method also may include: preventing operation of the demodulator circuit in response to receiving the settling indicator having the first value; and beginning operation of the demodulator circuit in response to receiving the settling indicator having the second value.

In yet another aspect, an apparatus includes: a RF front end circuit to receive and process a RF signal, the RF front end circuit having a first controllable gain; a downconverter to downconvert the RF signal to a second frequency signal; a programmable amplifier coupled to the downconverter to amplify the second frequency signal, the programmable amplifier having a second controllable gain; a digitizer to digitize the second frequency signal to a digitized signal; a demodulator to demodulate the digitized signal; and a controller to dynamically update at least one of the first controllable gain and the second controllable gain during a preamble of a packet communication. The controller may be configured to prevent operation of the demodulator until the dynamic updated is at least substantially completed.

In an example, the controller is to send a settling indicator to the demodulator having a first value to indicate that the dynamic update is not at least substantially completed and a second value to indicate that the dynamic updated is at least substantially completed. The demodulator may begin operation in response to the second value of the settling indicator.

In an example, the controller is to determine: that a gain value change does not exceed a threshold level during a settling window; and thereafter determine that a delay window has terminated. In an example, the controller is to send the settling indicator to the demodulator having the second value in response to determining that the delay window has terminated.

DETAILED DESCRIPTION OF ILLUSTRATIVE EMBODIMENTS

Figure 1:
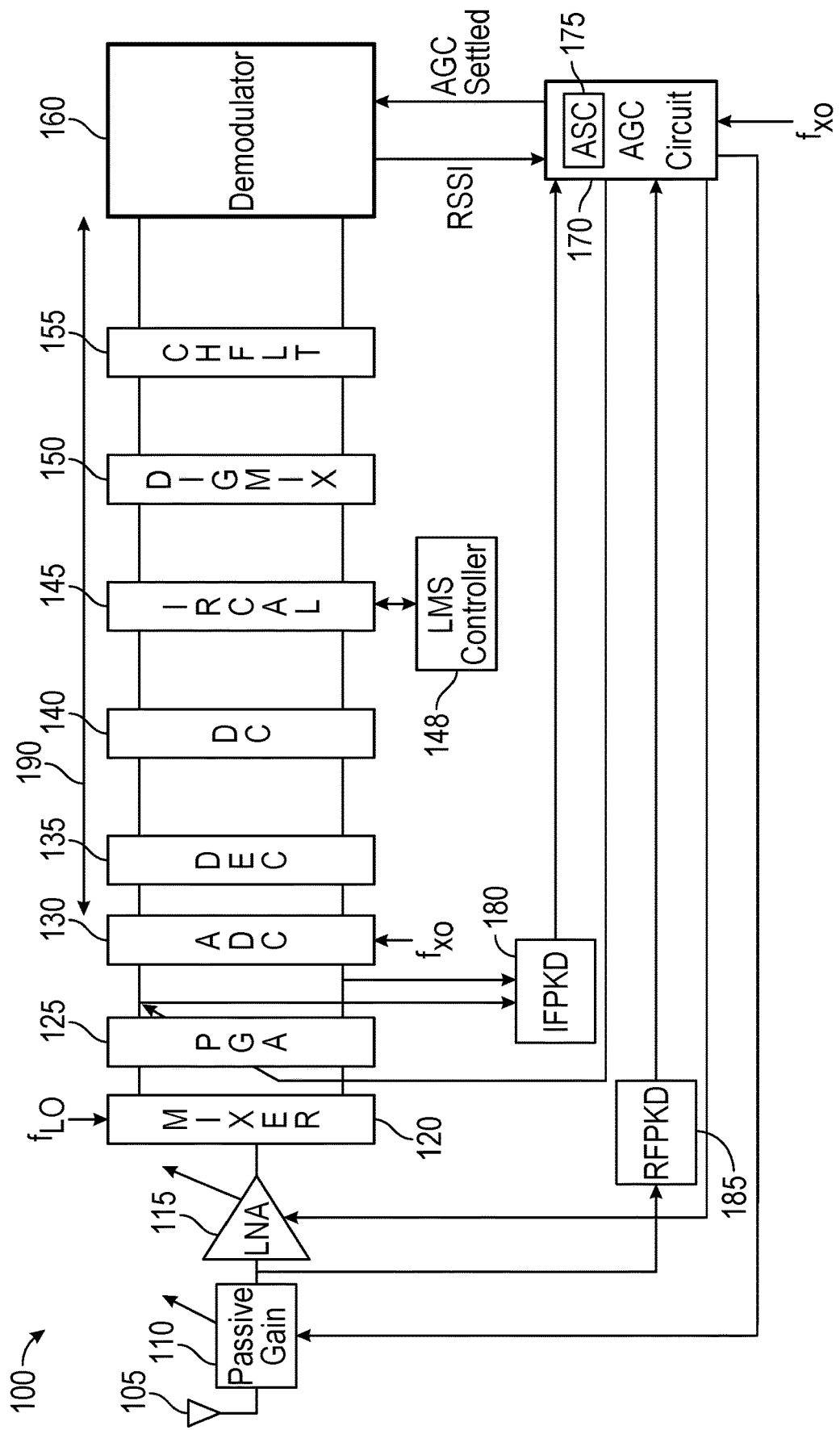
FIG. 1 is a block diagram of a receiver in accordance with an embodiment.

In various embodiments, a receiver is provided with techniques for performing automatic gain control (AGC) operations in a manner to quickly update gain settings of various gain components of the receiver so that communicated information is not lost. More specifically, embodiments may be used in receivers for a wide range of communication protocols in which AGC component updates can occur within a preamble portion of the packet communication. These gain settings can be updated and finalized prior to communication of actual payload data of the packet. As examples, packet-based protocols such as Bluetooth™, Zigbee™, as well as many other Internet of Things (IoT) protocols may leverage embodiments. Embodiments also may be applicable to receivers for other signals including orthogonal frequency division multiplexing (OFDM) signals and constant amplitude modulated signals (such as orthogonal frequency division multiplexing (OFDM), frequency shift keying (FSK), Gaussian frequency shift keying (GFSK), offset quadrature frequency shift key (OQPSK), binary phase shift keying (BPSK), on-off keying (OOK), amplitude shift keying (ASK), minimum shift keying (MSK)), and other sub-gigahertz (GHz) IoT use cases.

In embodiments, an AGC technique may be adapted to settle at the arrival of a packet before an actual payload starts. This settled state occurs when substantial gain control updates have been completed. At the end of a settling period, gain has been typically adjusted to a minimum level at which a required signal-to-noise ratio (SNR) (such as a SNR specified by a receiver manufacturer, or a SNR specified by a given communication protocol) is met, with a few decibels (dB) of margin. In this way, the dynamic range of the receive chain is maximized and therefore the saturation of a receiver channel is prevented if a relatively strong blocker arrives during reception of desired data.

In addition, a controller, either included within AGC circuitry or as separate circuitry, may determine when the AGC circuit has sufficiently settled, and when so, can cause downstream circuitry such as a demodulator to begin operation. In one particular implementation, this settling detector may be implemented as hardware, e.g., a hardware state machine that may be implemented within the AGC circuit itself.

Note that in different implementations, different and possibly programmable conditions may identify an AGC circuit's state as settled or not settled. For example, a settling detector may monitor AGC gain changes, and use one or more programmable timers to indicate when gain circuitry of a receiver has settled. The definition of 'settled' can be controlled via programmable timers and gain change thresholds. For example, a settled signal may be achieved when a receiver gain changes by less than a threshold amount (e.g., GAINTHRESHOLD, which may be in terms of decibels (dB) (and in a particular embodiment may be 2 dB) over a given time duration (e.g., SETTLEPERIOD, which may be in terms of seconds). In an embodiment, a demodulator may be controlled to begin searching for a desired signal after any receiver gain transients have passed, in response to an indication of achieving this settled state.

Referring now to FIG. 1, shown is a block diagram of a receiver in accordance with an embodiment. As shown in FIG. 1, receiver 100 is a radio receiver, which may be implemented in a single semiconductor die of an integrated circuit. As shown, incoming radio frequency (RF) signals are received via an antenna 105 (which may be an off-chip antenna). In turn, the incoming RF signals are provided to a passive gain stage 110. Although embodiments are not limited in this regard, passive gain stage 110 may be implemented with an inductor (L) and parallel-coupled capacitance (C) and resistance (R). In different embodiments, one or more of these RLC components can be dynamically controlled to control an amount of gain, such that passive gain stage 110 is considered a first gain control region of receiver 100. Although embodiments are not limited in this regard, in one particular embodiment passive gain stage 110 may provide for a controllable gain range of approximately 26 dB (e.g., with 2 dB steps per update). In one embodiment, the resistance R may be dynamically controlled to adjust the gain setting of this first gain control region.

With further reference to FIG. 1, these gain controlled RF signals output from passive gain stage 110 are provided to a low noise amplifier (LNA) 115, where these signals may be further amplified in a gain controlled manner. LNA 115 constitutes a second gain control region of receiver 100. Although embodiments are not limited in this regard, in one particular embodiment LNA 115 may have a controllable gain range of approximately 18 dB (e.g., with 2 dB steps).

From LNA 115, the RF signals are provided to a mixer 120. In various embodiments, mixer 120 may downconvert the RF signals to intermediate frequency (IF) signals. Understand that as used herein the terms "intermediate frequency" and "IF" are used to refer to signals downconverted from an RF level to a lower frequency, and includes IF, low IF and zero IF signals.

As shown, the resulting downconverted signal may be output in a complex format (having in-phase (I) and quadrature phase (Q) portions). These downconverted signals are provided to another controllable gain stage, namely a programmable gain amplifier (PGA) 125, for further gain control. In the embodiment shown, PGA 125 constitutes a third gain control region. Although embodiments are not limited in this regard, in one particular implementation PGA 125 may have a controllable gain range of 20 dB (e.g., with 2 dB steps). The resulting signals are provided to an analog-to-digital converter (ADC) 130. ADC 130 may digitize the resulting signals according to a sampling frequency of a given clock frequency, e.g., a crystal oscillator clock frequency ($f_{xo}$).

Still referring to FIG. 1, the digitized signals output from ADC 130 may be provided to one or more decimators 135 that reduce sampling frequency. In representative receiver 100, additional digital processing may be performed, including DC balancing in a DC circuit 140, and image rejection calibration in an image rejection calibration circuit 145 (in turn controlled by a controller 148, which may be configured as a least mean square (LMS) controller). The resulting processed signals may be provided next to a digital mixer 150 and thereafter to a channel filter 155. The resulting filtered signals are provided to a demodulator 160.

While embodiments are not limited in this regard, in implementations herein demodulator 160 may be an OFDM demodulator to demodulate incoming digital signals according to an OFDM technique. In turn, demodulated signals may be provided for further processing such as audio processing or so forth, e.g., in an audio processor or other downstream processor (not shown for ease of illustration in FIG. 1).

With embodiments herein, demodulator 160 may be configured to delay processing of incoming signals until AGC settling within an AGC circuit 170 is completed. To this end, AGC circuit 170 may include an AGC settling circuit 175, details of which are described further herein. At a high level, when AGC circuit 170 has settled to a substantially steady state gain control setting for a given packet communication, AGC settling circuit 175 may send an AGC settled signal to demodulator 160. In embodiments herein, demodulator 160 may be configured to begin demodulation processing on incoming signals in response to this AGC settled signal.

Still with reference to FIG. 1, note the various control loops present for gain control. Specifically, an IF peak detector 180 is present to measure IF power at an output of PGA 125 and provide this information to AGC circuit 170. In turn, an RF peak detector 185 may measure RF power at an input of LNA 115 and provide this information to AGC circuit 170.

AGC circuit 170, in an embodiment, may include a dedicated microcontroller or other programmable hardware control circuit such as programmable logic. In other cases, AGC circuit 170 may be implemented using other hardware circuitry, firmware, software and/or combinations thereof to control gain settings of various gain components within receiver 100 based on the detected outputs from peak detectors 180, 185 and received signal strength information (RSSI) from demodulator 160. AGC circuit 170 may include a non-volatile storage or other non-transitory storage medium to store instructions and data usable for performing AGC operations and issuing a settled signal as described herein.

Also note in FIG. 1, a controllable amount of delay (depending upon modulation mode, bandwidth and so forth) exists between the output of ADC 130 and demodulator 160, identified as reference numeral 190. Delay 190 represents the latency for signals output from ADC 130 to traverse various elements of the signal processing path prior to input at demodulator 160. As described herein, loop delay 190 may correspond to a delay period or delay window.

Understand while shown at this high level in the embodiment of FIG. 1, variations and alternatives are possible. For example, while an exemplary signal processing path is described in FIG. 1, variations or additional components may be present and/or may be alternately configured. For example, in another implementation, AGC settling circuit 175 may be separate from AGC circuit 170. Also understand that in other implementations, a receiver leveraging an embodiment may take the form of one or more of the receivers shown and described in U.S. Pat. No. 10,230,345, which is hereby incorporated by reference.

Figure 2:
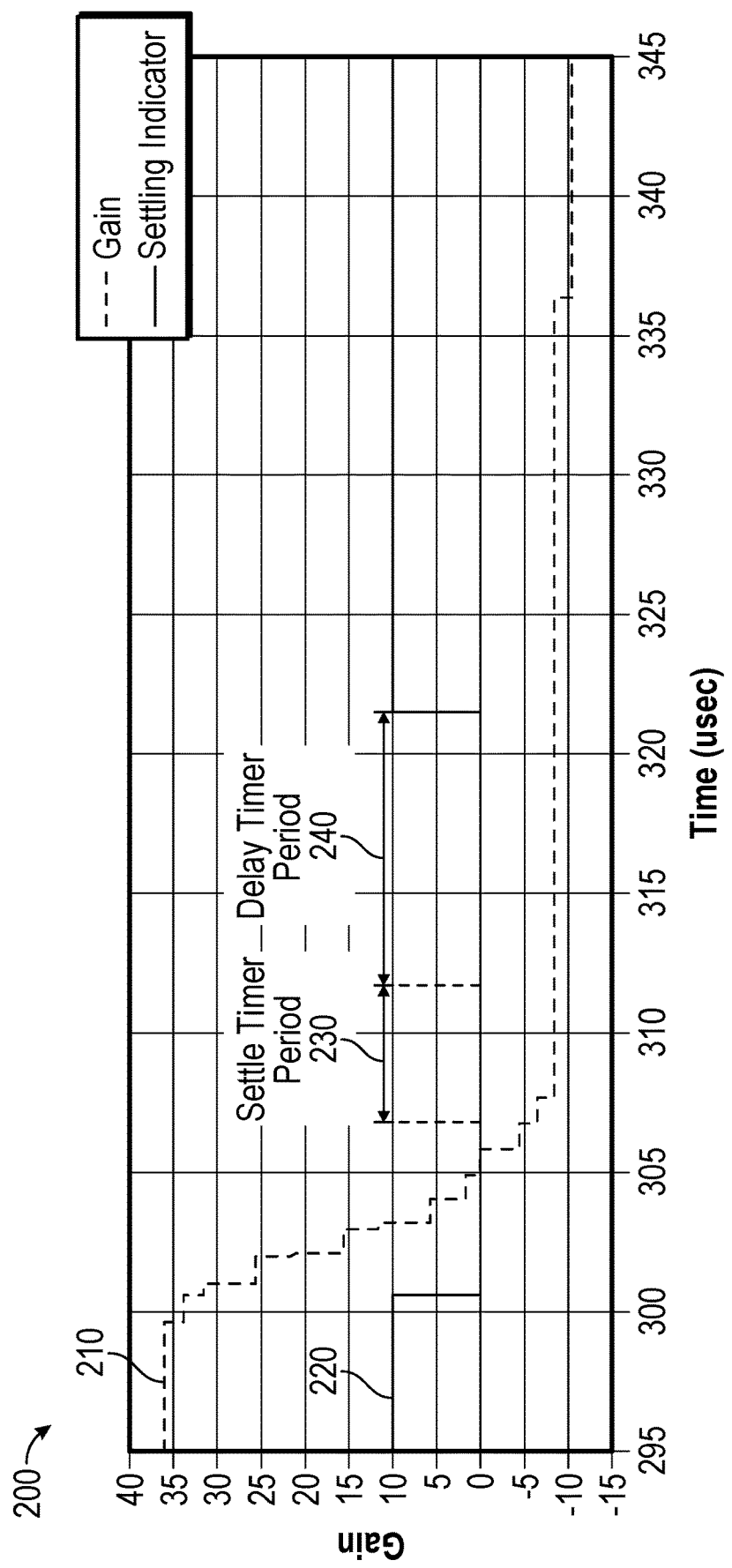
FIG. 2 is a graphical illustration of operation of a receiver having an AGC settling circuit in accordance with an embodiment.

Referring now to FIG. 2, shown is a graphical illustration of operation of a receiver having an AGC settling circuit in accordance with an embodiment. As shown in FIG. 2, graphical illustration 200 is a representation of gain (along the Y axis) over time (along the X axis). As shown, a first curve 210 represents gain (e.g., in dB). As illustrated, after an initial period in which the gain remains fixed at a relatively high level, gain rapidly reduces during a settling of an AGC circuit and thereafter becomes substantially steady.

FIG. 2 further shows a control signal, namely a settle indicator signal at curve 220. As illustrated, this signal begins in a high state, indicating that the AGC circuit is settled. Thereafter, as gain begins rapidly changing, the signal becomes inactive, indicating that the AGC circuit has not settled.

As will be described further herein, when gain changes begin to slow down, a settle timer period 230 is incurred in which the gain change during this period is below one or more threshold levels. Although embodiments are not limited in this regard, in one implementation settle timer period 230 may be set at 5 microseconds (μs). Thereafter, a delay timer period 240 is incurred. In embodiments, delay timer period 240 may be a programmable value corresponding to a channel filter loop delay, extending from an output of an ADC to an input of a demodulator. Although embodiments are not limited in this regard, in one implementation for a given bandwidth of operation the delay timer period 240 may be 9 microseconds.

As shown in FIG. 2 at the conclusion of delay timer period 240 the settle indicator signal goes high, indicating that the AGC circuit has settled. This signal may act as a control input to cause demodulation operations to begin. Understand while shown with this particular control in FIG. 2, variations and alternatives are possible.

Figure 3:
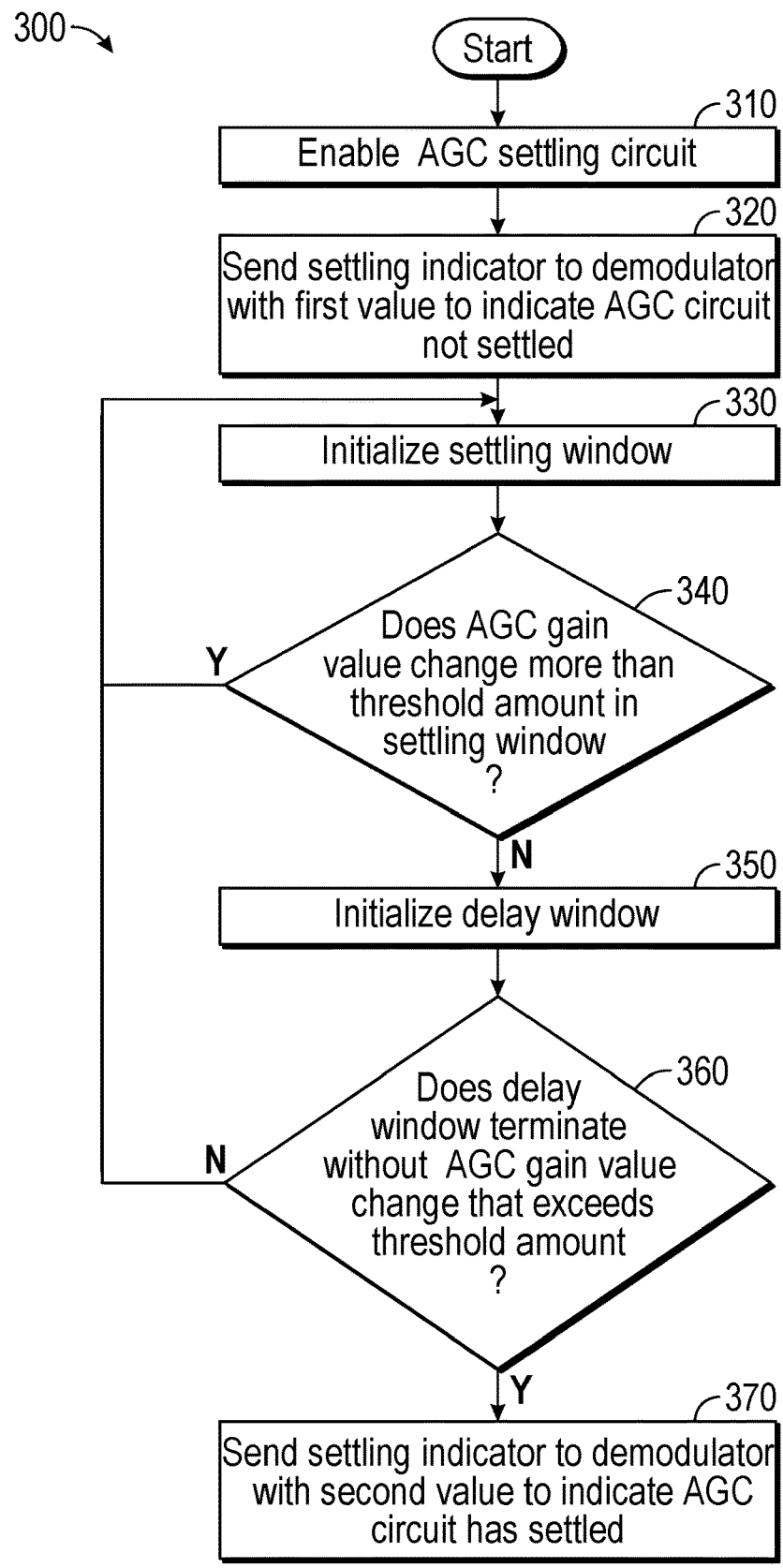
FIG. 3 is a flow diagram of a method in accordance with an embodiment.

Referring now to FIG. 3, shown is a flow diagram of a method in accordance with an embodiment. More specifically, method 300 shown in FIG. 3 is a method for operating an AGC settling circuit. In turn the AGC settling circuit may cause a demodulator to begin operation only when an AGC circuit has settled. In embodiments, method 300 may be performed by hardware circuitry, such as an AGC settling circuit, firmware, software and/or combinations thereof.

As illustrated, method 300 begins by enabling the AGC settling circuit (block 310). This enabling may be performed by configuration circuitry in response to an enable bit, e.g., as communicated via a register setting. Next, at block 320 a settling indicator may be sent to the demodulator with a first value to indicate that the AGC circuit is not settled. In an embodiment, this settling indicator may be sent as a signal from the AGC settling circuit to the demodulator with the first value (which may be a logic low value) to indicate this non-settled state. Next, at block 330 a settling window may be initialized. Note that the length of the settling window can vary in different embodiments. For an OFDM demodulator, this settling window may be set at 5 μs as an example.

Still with reference to FIG. 3, at diamond 340 it may be determined whether an AGC gain value change is more than a threshold amount within this settling window. If so, control passes back to block 330 for another initialization of the settling window. Otherwise, if the settling window concludes without an AGC gain value change that exceeds this threshold amount, control passes to block 350 where a delay window may be initialized. In one embodiment, this delay window may be set at 9 μs as an example.

Next at diamond 360, it may be determined whether the delay window terminates without an AGC gain value change that is more than the threshold amount. If the gain change exceeds the threshold, control passes back to block 330 for another initialization of the settling window. Otherwise, if the delay window concludes without an AGC gain value change that exceeds this threshold amount, control passes to block 370.

Finally, still with reference to FIG. 3 at block 370 the settling indicator may be sent to the demodulator with a second value to indicate that the AGC circuit has settled. Note that in response to this settling indicator, the demodulator may begin its demodulation operations on incoming signals.

Understand while shown at this high level in the embodiment of FIG. 3, many variations and alternatives are possible. For example in other cases, the determination at diamond 360 may simply be as to whether the delay window has completed (without a further consideration of gain changes). Although not shown in FIG. 3, in embodiments when the AGC circuit is locked by the demodulator, the AGC settling circuit may be disabled.

Further note that in embodiments, after an AGC circuit has settled, and an incoming signal causes further significant AGC changes (e.g., greater than a GAINTHRESHOLD), the AGC circuit may revert to the unsettled state (resulting in the settling indicator being reset). After the settling criteria are again met, the settling indicator can again be asserted, allowing the demodulator to re-start signal search after any significant gain transient periods.

Further understand that while embodiments may be used in connection with any radio circuits, certain implementations may be particularly applicable to OFDM-based receivers that use high peak-to-average signals. In such implementations, demodulator false detections may be avoided during receiver gain transients. And in response to an asserted settling indicator, the demodulator may start/enable short training field (STF) detection for an incoming communication. In addition, a settling indicator in accordance with an embodiment can be used as a signal to modify AGC parameters after initial settling is complete, to reduce probability of late (small) gain changes that might interfere with desired signal detection, or otherwise optimize the AGC circuit to operate more aggressively when gain changes are large, as compared to when gain changes are small (e.g., less than the GAINTHRESHOLD).

Figure 4:
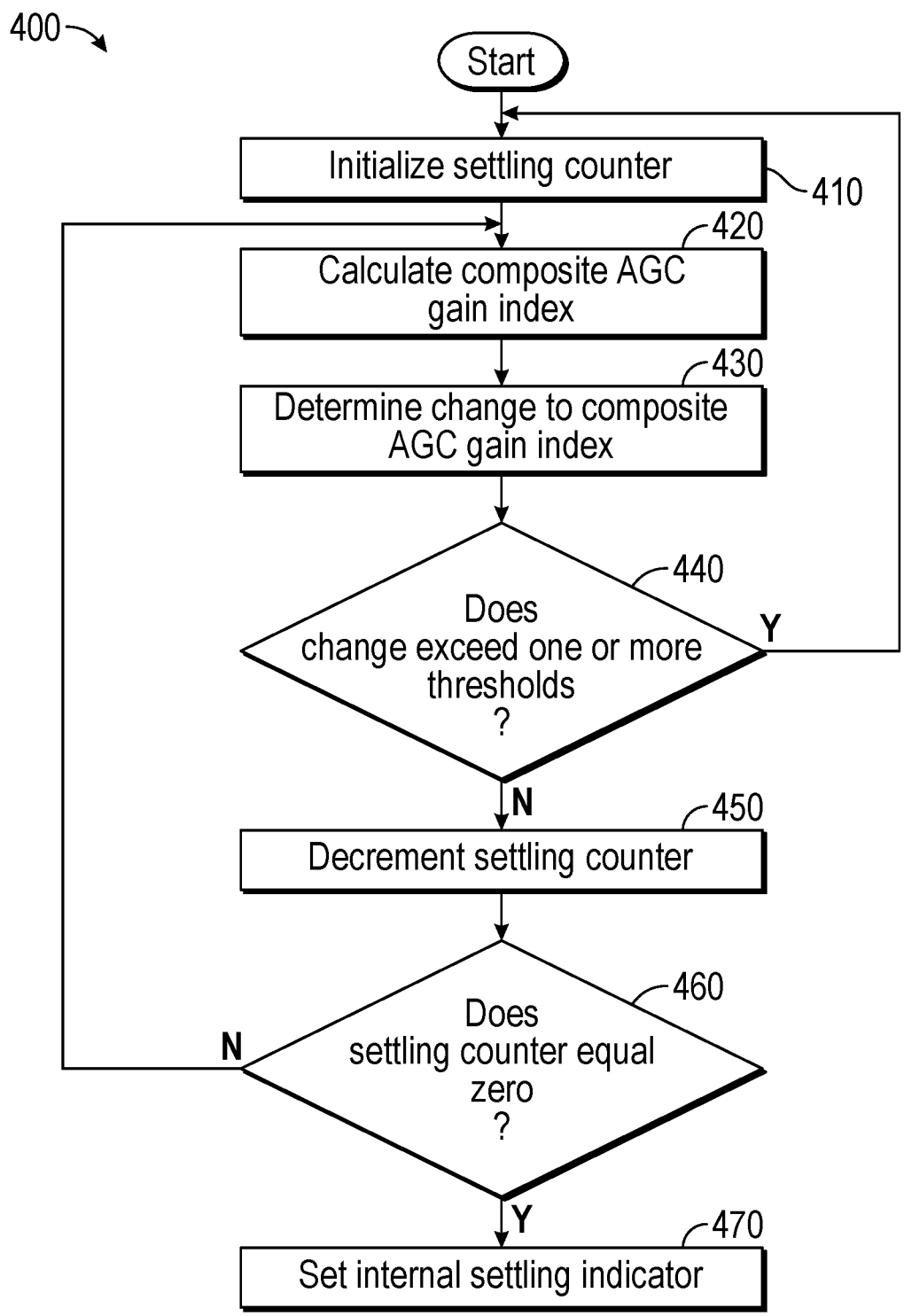
FIG. 4 is a flow diagram of a method in accordance with another embodiment.

There may be various operations performed in determining whether an AGC gain value change exceeds a given threshold. Referring now to FIG. 4, shown is a flow diagram of a method in accordance with another embodiment. More specifically, method 400 is a method for processing gain control information during a settling period. As such, method 400 may be performed by hardware circuitry, such as an AGC settling circuit, firmware, software and/or combinations thereof.

As illustrated, method 400 may begin by initializing a settling counter (block 410). The settling counter may be implemented as a decrementing counter and may be set to a programmable value, e.g., as communicated via a register setting. Next at block 420, a composite AGC gain index may be calculated. Although embodiments are not limited in this regard, in one example this composite AGC gain index may be calculated according to a sum of individual gain indexes for each of multiple controllable gain stages, e.g., a front end gain stage, an LNA, and a PGA. Also in this implementation, each gain index may be an integer value corresponding to a given gain control value for the stage.

Still with reference to FIG. 4, next at block 430 a change in the composite AGC gain index (from a previous composite index) may be determined. Thereafter, at diamond 440 it may be determined whether this change exceeds one or more thresholds. Although embodiments are not limited in this regard, there may be multiple thresholds, namely positive and negative thresholds, each of which can be controllable values. If it is determined that the change exceeds at least one of these thresholds, control passes back to block 410 discussed above. Note also at this point when a gain change exceeds a threshold, in addition to resetting the settling counter, a previous composite AGC gain index may be reset to the current index.

Otherwise if it is determined at diamond 440 that the change does not exceed such threshold(s), control passes to block 450 where the settling counter may be decremented. Next it is determined at diamond 460 whether this settling counter equals zero. If not, control passes back to block 420 for another calculation of a composite AGC gain index. Instead when it is determined that the settling counter equals zero, at block 470 an internal settling indicator may be set. Note that this internal settling indicator identifies that the settling period has completed without a significant gain change. As such, the AGC settling circuit may next proceed through a delay period.

Figure 5:
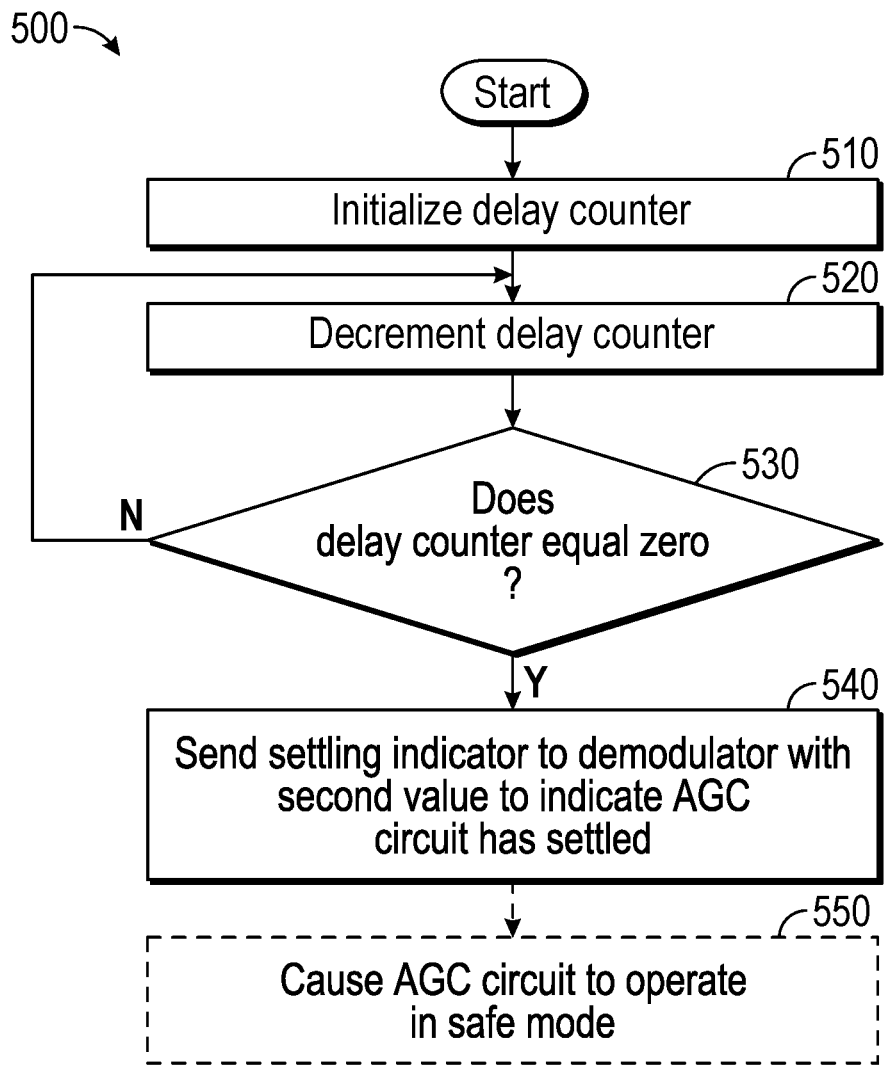
FIG. 5 is a flow diagram of a method in accordance with yet another embodiment.

Referring now to FIG. 5, shown is a flow diagram of a method in accordance with yet another embodiment. More specifically, method 500 is a method for processing operations during a delay period. As such, method 500 may be performed by hardware circuitry, such as an AGC settling circuit, firmware, software and/or combinations thereof.

As illustrated, method 500 may begin by initializing a delay counter (block 510). The delay counter may be implemented as a decrementing counter (and may be the same or different hardware counter used for the settling counter) and may be set to a programmable value, e.g., as communicated via a register setting. Next at block 520 the delay counter may be decremented.

Next at diamond 530 it may be determined whether the delay counter equals zero. If so, control passes to block 540 where the settling indicator can be sent to the demodulator with a second value (e.g., a logic high value) to indicate that the AGC circuit has settled. As such, at this point the demodulator may begin operation. Note also at this point, a previous AGC gain index is set to the current AGC gain index. If any further change relative to this value exceeds the threshold(s), the set settling indicator may be reset, and the settling counter may be restarted.

As further shown at optional block 550 at this point when the AGC circuit has settled, the AGC circuit itself may be caused to be placed into a safe mode of operation, such that greater changes in feedback information (e.g., power measurements from one or more peak detectors) may occur before any gain control change is made. In an embodiment, certain gain control values may be updated to prevent small gain changes from occurring. In this way, should a larger signal arrive and a large AGC gain step occurs, the settling indicator may be reset until the AGC circuit again settles.

Figure 6:
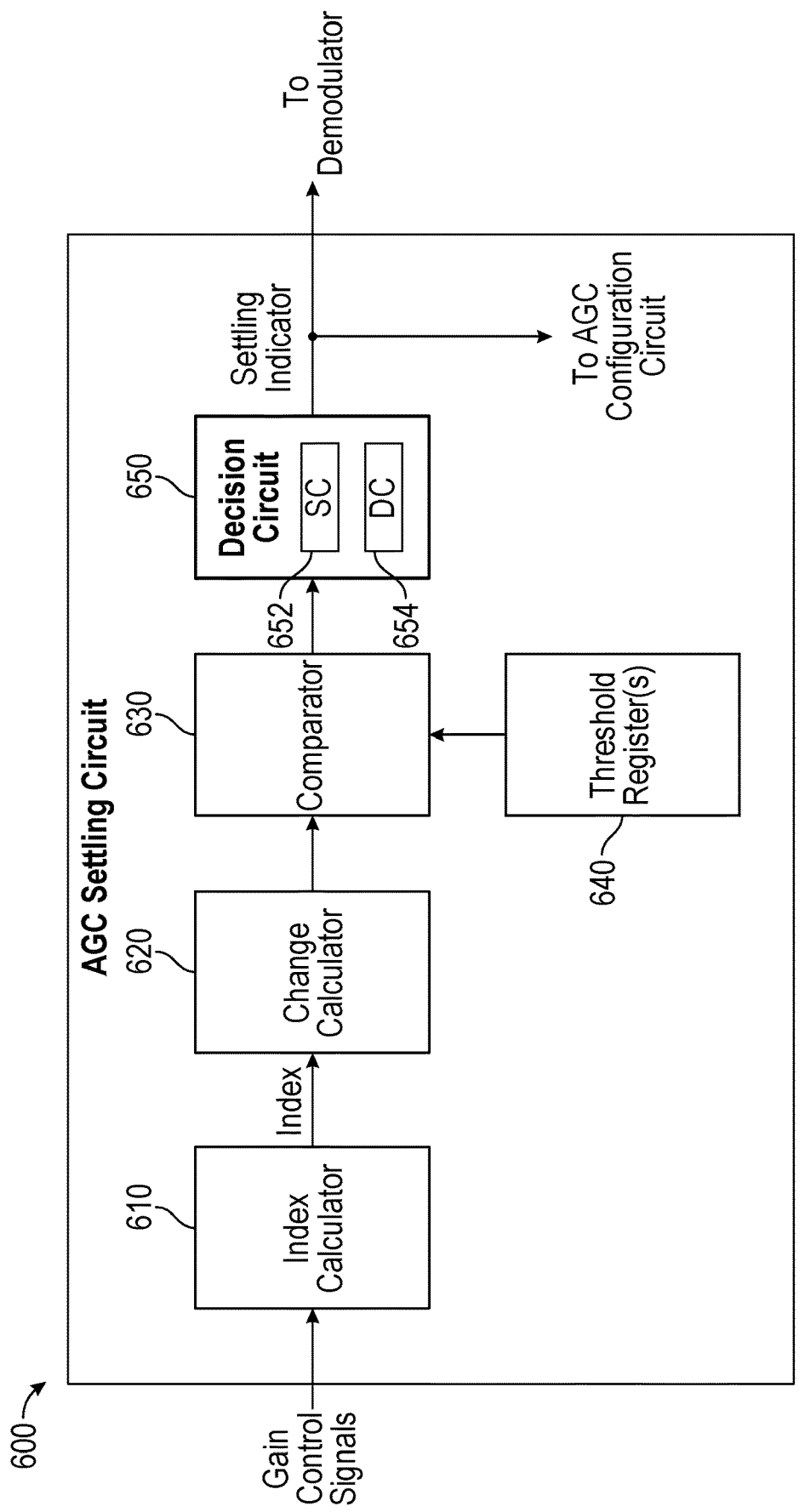
FIG. 6 is a block diagram of an AGC settling circuit in accordance with an embodiment.

Referring now to FIG. 6, shown is a block diagram of an AGC settling circuit in accordance with an embodiment. In FIG. 6, settling circuit 600 may be implemented as dedicated hardware circuitry. In other implementations, an AGC settling circuit may be implemented as a microcontroller or other programmable hardware logic. As seen, settling circuit 600 receives gain control signals in an index calculator 610. These gain control signals may be received from the AGC circuit and may represent gain control indices for each of multiple control gain stages. Index calculator 610 may calculate a composite AGC gain index as described herein. In turn, this composite index is provided to a change calculator 620, which may determine a change in this composite index, e.g., from a previous stored composite index value. This change in turn is provided to a comparator 630 which may compare the change to one or more thresholds, obtained from threshold registers 640.

Still with reference to FIG. 6, the comparison result is provided to a decision circuit 650, which may include one or more counters. In the particular embodiment of FIG. 6, decision circuit 650 includes a settling counter 652 and a delay counter 654. While shown with two separate counters, understand that in different implementations a single hardware counter may be provided and programmably controlled to act as a settling counter for use during a settling period and thereafter act as a delay counter for use during a delay period. In an embodiment, decision circuit 650 may decrement settling counter 652 while the AGC circuit does not change by more than a threshold amount. And in turn, decision circuit 650 may decrement delay counter 654 to time align the settled incoming signal to a demodulator input.

Still with reference to FIG. 6, based on operation of decision circuit 650, when it is determined that the AGC circuit has settled, a settling indicator may be output with, e.g., a logic high value, to trigger the demodulator to begin demodulation operations. As further shown in FIG. 6, this settling indicator may be sent to AGC configuration circuitry to cause the AGC circuit to enter into a so-called safe mode. That is, in certain embodiments when an AGC circuit has settled, the AGC circuit itself may be placed into this safe mode in which further gain changes can be controlled to be of smaller range, allowing the AGC circuit to remain in the settled state even when certain gain changes occur. To this end, embodiments may further leverage the settling indicator, when asserted, to cause the AGC circuit to enter into this safe mode of operation.

Figure 7:
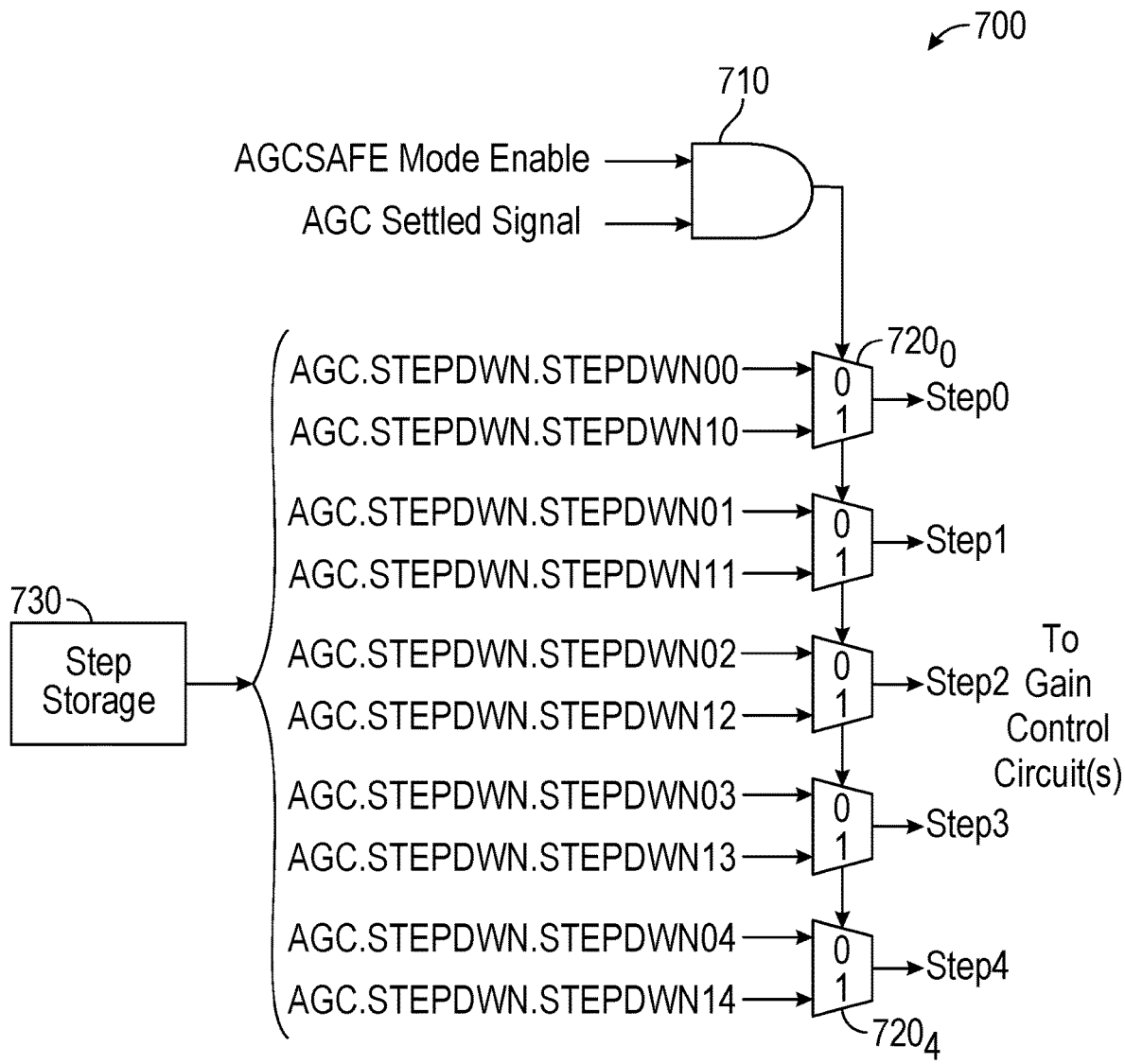
FIG. 7 is a block diagram of further circuitry of an AGC circuit in accordance with an embodiment.

Referring now to FIG. 7, shown is a block diagram of further circuitry of an AGC circuit. In accordance with an embodiment as shown in FIG. 7, circuit 700 may be used to control entry into a safe mode of operation. Specifically as shown in FIG. 7, circuit 700 includes a logic circuit 710, implemented as an AND gate that receives the settling indicator (AGC Settled Signal) and a safe mode enable signal (AGCSAFE Mode Enable), which may be controlled based on configuration of a receiver.

As shown, the output of logic gate 710 may be used to control a plurality of selection circuits $720_0$-$720_4$ to output one of multiple gain control signals (referred to as step signals). In embodiments, when safe mode is enabled selection circuits 720 may be controlled to output these step signals with smaller magnitude values, leading to smaller gain changes and thus enabling the AGC circuit to remain in a settled state for greater durations.

As shown, these step control signals may be received from a step storage 730 which in different implementations may be a non-volatile storage that stores these values as fused values. In an embodiment, multiple sets of gain control values (referred to as step values) may be provided, a first set for use before settling and a second set for use after settling. The first set may have large gain control changes between index values (as compared to the second set). In this way, greater gain changes may occur before the AGC circuit settles. In another implementation, step storage 730 may be implemented as registers to store programmable step values, e.g., received on start up of a receiver from an off-chip non-volatile storage. Understand while showing this particular implementation in FIG. 7, many variations and alternatives are possible.

Figure 8:
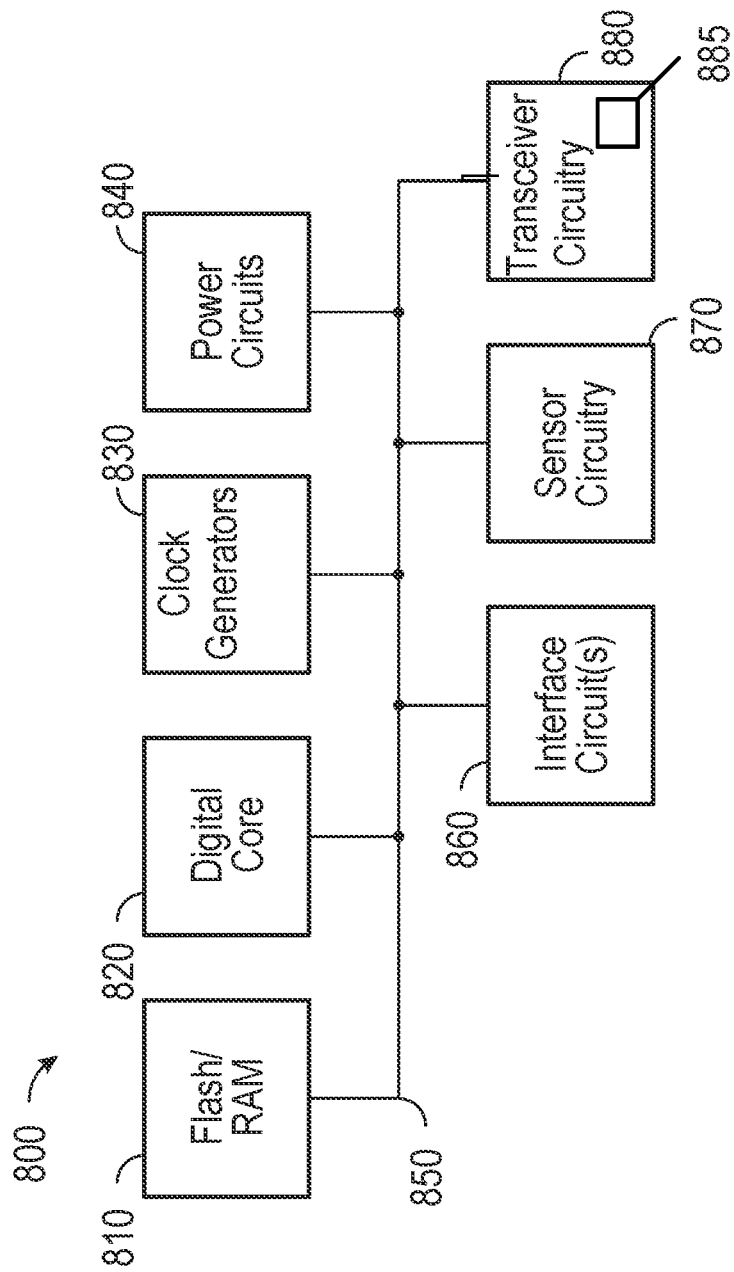
FIG. 8 is a block diagram of a representative integrated circuit in accordance with an embodiment.

Referring now to FIG. 8, shown is a block diagram of a representative integrated circuit 800 which may include AGC control circuitry as described herein. In the embodiment shown in FIG. 8, integrated circuit 800 may be, e.g., a microcontroller, wireless transceiver or other device that can be used in a variety of use cases, including sensing, metering, monitoring, embedded applications, communications, applications and so forth, and which may be particularly adapted for use in an IoT device.

In the embodiment shown, integrated circuit 800 includes a memory system 810 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for controlling operation of a demodulator, including providing an AGC settling indication to the demodulator to cause it to begin operation, when an AGC settling circuit has determined that an AGC circuit has settled, as described herein.

Memory system 810 couples via a bus 850 to a digital core 820, which may include one or more cores and/or microcontrollers that act as a main processing unit of the integrated circuit. In turn, digital core 820 may couple to clock generators 830 which may provide one or more phase locked loops or other clock generator circuitry to generate various clocks for use by circuitry of the IC.

As further illustrated, IC 800 further includes power circuitry 840, which may include one or more voltage regulators. Additional circuitry may optionally be present depending on particular implementation to provide various functionality and interaction with external devices. Such circuitry may include interface circuitry 860 which may provide interface with various off-chip devices, sensor circuitry 870 which may include various on-chip sensors including digital and analog sensors to sense desired signals, such as for a metering application or so forth.

In addition as shown in FIG. 8, transceiver circuitry 880 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. As shown transceiver circuitry 880 includes an AGC circuit 885 having an associated AGC settling detector to provide an AGC settling indication to a demodulator, as described herein. Understand while shown with this high level view, many variations and alternatives are possible.

Note that ICs such as described herein may be implemented in a variety of different devices such as IoT device. This IoT device may be a smart utility meter for use in a smart utility network, e.g., a mesh network in which communication is according to an IEEE 802.15.4 specification.

Figure 9:
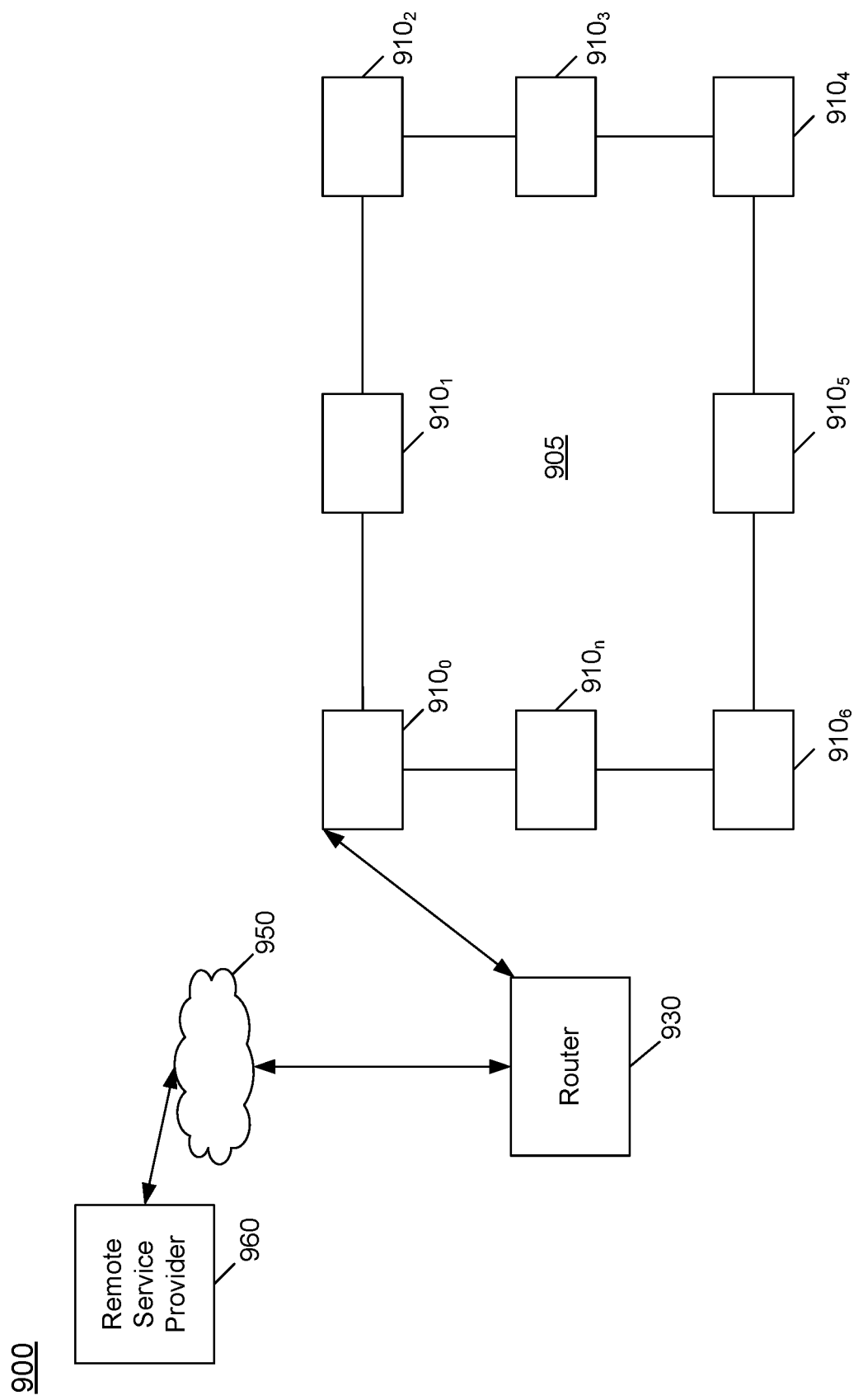
FIG. 9 is a high level diagram of a network in accordance with an embodiment.

Referring now to FIG. 9, shown is a high level diagram of a network in accordance with an embodiment. As shown in FIG. 9, a network 900 includes a variety of devices, including smart devices such as IoT devices, routers and remote service providers. In the embodiment of FIG. 9, a mesh network 905 may be present, e.g., in a neighborhood having multiple IoT devices $910_{0-n}$. Such IoT devices may control demodulator operation on a packet to begin in response to determining that an AGC circuit has at least substantially settled, as described herein. As shown, at least one IoT device 910 couples to a router 930 that in turn communicates with a remote service provider 960 via a wide area network 950, e.g., the internet. In an embodiment, remote service provider 960 may be a backend server of a utility that handles communication with IoT devices 910. Understand while shown at this high level in the embodiment of FIG. 9, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a low noise amplifier (LNA) to receive and amplify a radio frequency (RF) signal, the LNA having a first controllable gain;
a mixer to downconvert the RF signal to a second frequency signal;
a programmable gain amplifier (PGA) coupled to the mixer to amplify the second frequency signal, the PGA having a second controllable gain;
a digitizer to digitize the second frequency signal to a digitized signal;
a demodulator coupled to the digitizer to demodulate the digitized signal;
an automatic gain control (AGC) circuit to control one or more of the first controllable gain and the second controllable gain; and
an AGC settling circuit to cause the demodulator to begin operation in response to determining that the AGC circuit has settled.

2. The apparatus of claim 1, wherein the AGC settling circuit is to send a settling indicator to the demodulator having a first value before the AGC circuit has settled and having a second value in response to determining that the AGC circuit has settled.

3. The apparatus of claim 2, wherein the demodulator is prevented from operation in response to the settling indicator having the first value.

4. The apparatus of claim 2, wherein the AGC settling circuit comprises a decision circuit to determine whether a gain change is greater than at least one threshold during a first duration.

5. The apparatus of claim 4, wherein the decision circuit, in response to determining that the gain change is less than the at least one threshold during the first duration, is to send the settling indicator having the second value after a second duration following the first duration.

6. The apparatus of claim 4, further comprising a calculation circuit to calculate a composite gain index according to a sum of a first gain index for the LNA and a second gain index for the PGA.

7. The apparatus of claim 6, further comprising a passive gain stage coupled to the LNA, the passive gain stage having a third controllable gain, and wherein the calculation circuit is to calculate the composite gain index according to a second sum of the first gain index for the LNA, the second gain index for the PGA, and a third gain index for the passive gain stage.

8. The apparatus of claim 6, wherein the decision circuit is to determine the gain change based on the composite gain index and a prior composite gain index.

9. The apparatus of claim 4, wherein the AGC settling circuit comprises a first counter to count a first count corresponding to the first duration, wherein the decision circuit is to reset the first counter in response to determining that the gain change is greater than the at least one threshold during the first duration.

10. The apparatus of claim 1, wherein the AGC circuit is to enter into a safe mode when the AGC circuit has settled, wherein in the safe mode, the AGC circuit is to limit an amount of gain change to one or more of the LNA and the PGA.

11. The apparatus of claim 1, further comprising a non-volatile storage to store a first set of gain control values and a second set of gain control values, wherein the AGC circuit is to send the first set of gain control values to at least the LNA and the PGA before the AGC circuit is settled and send the second set of gain control values to at least the LNA and the PGA after the AGC circuit is settled.

12. A method comprising:
sending a settling indicator from a first circuit to a demodulator circuit of a receiver, the settling indicator having a first value to indicate that an automatic gain control (AGC) circuit of the receiver is not settled;
determining that an AGC gain value change does not exceed a threshold level during a settling window; and
thereafter sending the settling indicator to the demodulator circuit having a second value to indicate that the AGC circuit has settled.

13. The method of claim 12, further comprising initializing a delay window following a completion of the settling window.

14. The method of claim 13, further comprising initializing the settling window in response to the AGC gain value change exceeding the threshold level during the settling window.

15. The method of claim 13, further comprising sending the settling indicator having the second value after the delay window is completed.

16. The method of claim 12, further comprising:
preventing operation of the demodulator circuit in response to receiving the settling indicator having the first value; and
beginning operation of the demodulator circuit in response to receiving the settling indicator having the second value.

17. An apparatus comprising:
a radio frequency (RF) front end circuit to receive and process a RF signal, the RF front end circuit having a first controllable gain;
a downconverter to downconvert the RF signal to a second frequency signal;
a programmable amplifier coupled to the downconverter to amplify the second frequency signal, the programmable amplifier having a second controllable gain;
a digitizer to digitize the second frequency signal to a digitized signal;
a demodulator to demodulate the digitized signal; and
a controller to dynamically update at least one of the first controllable gain or the second controllable gain during a preamble of a communication, wherein the controller is to prevent operation of the demodulator until the dynamic update is at least substantially completed.

18. The apparatus of claim 17, wherein the controller is to send a settling indicator to the demodulator having a first value to indicate that the dynamic update is not at least substantially completed and a second value to indicate that the dynamic update is at least substantially completed, wherein the demodulator is to begin operation in response to the second value of the settling indicator.

19. The apparatus of claim 18, wherein the controller is to determine:
that a gain value change does not exceed a threshold level during a settling window; and
thereafter determine that a delay window has terminated.

20. The apparatus of claim 19, wherein the controller is to send the settling indicator to the demodulator having the second value in response to determining that the delay window has terminated.

* * * * *